A2

US006901562B2

(12) United States Patent
Cooke et al.

(10) Patent No.: US 6,901,562 B2
(45) Date of Patent: May 31, 2005

(54) ADAPTABLE CIRCUIT BLOCKS FOR USE IN MULTI-BLOCK CHIP DESIGN

(75) Inventors: Laurence H. Cooke, Los Gatos, CA (US); Kumar Venkatramani, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 361 days.

(21) Appl. No.: 09/766,311

(22) Filed: Jan. 18, 2001

(65) Prior Publication Data

US 2001/0034593 A1 Oct. 25, 2001

Related U.S. Application Data

(60) Provisional application No. 60/176,879, filed on Jan. 18, 2000, and provisional application No. 60/216,746, filed on Jul. 3, 2000.

(51) Int. Cl.$^7$ .............................................. G06F 17/50
(52) U.S. Cl. ...................... 716/1; 716/1; 716/7; 716/18
(58) Field of Search ............................ 716/1–3, 15, 16, 716/18, 21, 10, 11; 703/14–17, 20–22; 710/100, 128, 56, 62

(56) References Cited

U.S. PATENT DOCUMENTS 4,354,268 A   10/1982  Michel et al.
4,872,169 A   10/1989  Whetsel, Jr.

(Continued)

FOREIGN PATENT DOCUMENTS

EP      0 466 939 A1    1/1992
GB      2 326 065 A    12/1998

OTHER PUBLICATIONS

Chao, Ting–Hai et al., "A Clock Net Routing Algorithm For High–Performance VLSI", *IEEE* 1992, pp. 343–347.
Jackson, Michael A.B. et al., "Clock Routing For High Performace ICs", *27$^{th}$ ACM/IEEE Design Automation Conference* 1990, pp. 573–579.
Khan, Wasim et al., "An Hierarchical Approach to Clock Routing in High Performance Systems", *IEEE* 1994, pp. 467–470.
Sato, Hidenori et al., "A Balanced–Mesh Clock Routing Technique Using Circuit Partitioning", *IEEE* 1996, pp. 237–243.

(Continued)

*Primary Examiner*—Vuthe Siek
*Assistant Examiner*—Binh C. Tat
(74) *Attorney, Agent, or Firm*—Bingham McCutchen LLP

(57) ABSTRACT

Techniques for increasing flexibility in use of virtual component blocks include a method for hardening a foundation block, a pin-unscrambling methodology for semi-hardened virtual component blocks, and parameterizable virtual component blocks. A method for hardening a foundation block and utilizing it in a circuit design comprises the steps of defining a virtual component foundation block, hardening an interior region of the foundation block including at least the critical timing components such as the system bus. The foundation block has a "soft collar" for allowing interface parameters to be specified when the foundation block is incorporated into a circuit design. In addition, the foundation block may comprise an internal, hierarchical clocking scheme for even clock distribution and optimum performance. For example, all internal clock delays may be padded, except the longest one, so that the clock signal arrives at all relevant reference points within the foundation block at the same time.

24 Claims, 10 Drawing Sheets

U.S. PATENT DOCUMENTS

| | | | |
|---|---|---|---|
| 5,537,652 A | 7/1996 | Tegethoff | |
| 5,557,779 A | 9/1996 | Minami | |
| 5,577,213 A | 11/1996 | Avery et al. | 395/280 |
| 5,581,669 A | 12/1996 | Voth | 395/113 |
| 5,644,754 A * | 7/1997 | Weber et al. | 703/24 |
| 5,701,309 A | 12/1997 | Gearhardt et al. | |
| 5,737,234 A | 4/1998 | Seidel et al. | 364/488 |
| 5,761,078 A | 6/1998 | Fuller et al. | 364/489 |
| 5,774,371 A | 6/1998 | Kawakami | |
| 5,838,583 A | 11/1998 | Varadarajan et al. | 364/491 |
| 5,960,186 A * | 9/1999 | Jones et al. | 703/4 |
| 5,983,303 A | 11/1999 | Sheafor et al. | |
| 6,034,542 A | 3/2000 | Ridgeway | |
| 6,102,961 A * | 8/2000 | Lee et al. | 716/1 |
| 6,134,606 A * | 10/2000 | Anderson et al. | 710/14 |
| 6,148,432 A | 11/2000 | Brown | |
| 6,154,873 A | 11/2000 | Takahashi | 716/10 |
| 6,237,128 B1 | 5/2001 | Folberth et al. | |
| 6,260,175 B1 | 7/2001 | Basel | |
| 6,269,467 B1 * | 7/2001 | Chang et al. | 716/1 |
| 6,286,128 B1 | 9/2001 | Pileggi et al. | |
| 6,292,929 B2 | 9/2001 | Scepanovic et al. | |
| 6,305,001 B1 | 10/2001 | Graef | |
| 6,311,302 B1 | 10/2001 | Cassetti et al. | |
| 6,311,313 B1 | 10/2001 | Camporese et al. | |
| 6,327,696 B1 | 12/2001 | Mahajan | |
| 6,347,395 B1 * | 2/2002 | Payne et al. | 716/18 |
| 6,367,051 B1 | 4/2002 | Pileggi et al. | |
| 6,367,060 B1 | 4/2002 | Cheng et al. | |

OTHER PUBLICATIONS

Su, Hsiao–Pin et al.; "A Timing–Driven Soft–Macro Placement and Resynthesis Method In Interaction With Chip Floorplanning"; *IEEE Transactions on Computer–Aided Design Of Integrated Circuits and Systems*; Apr. 1999; vol. 18, No. 4; pp. 475–483.

"Virtual Socket Interface Alliance (VSIA)", VCI Standard OCB 2, Ver. 1.0 Dec. 9, 1999, pp. 57.

International Search Report, PCT/US01/01738, May 1, 2001.

International Search Report, PCT/US01/20641, Jun. 28, 2001.

International Search Report, PCT/US01/01820, Apr. 18, 2001.

* cited by examiner

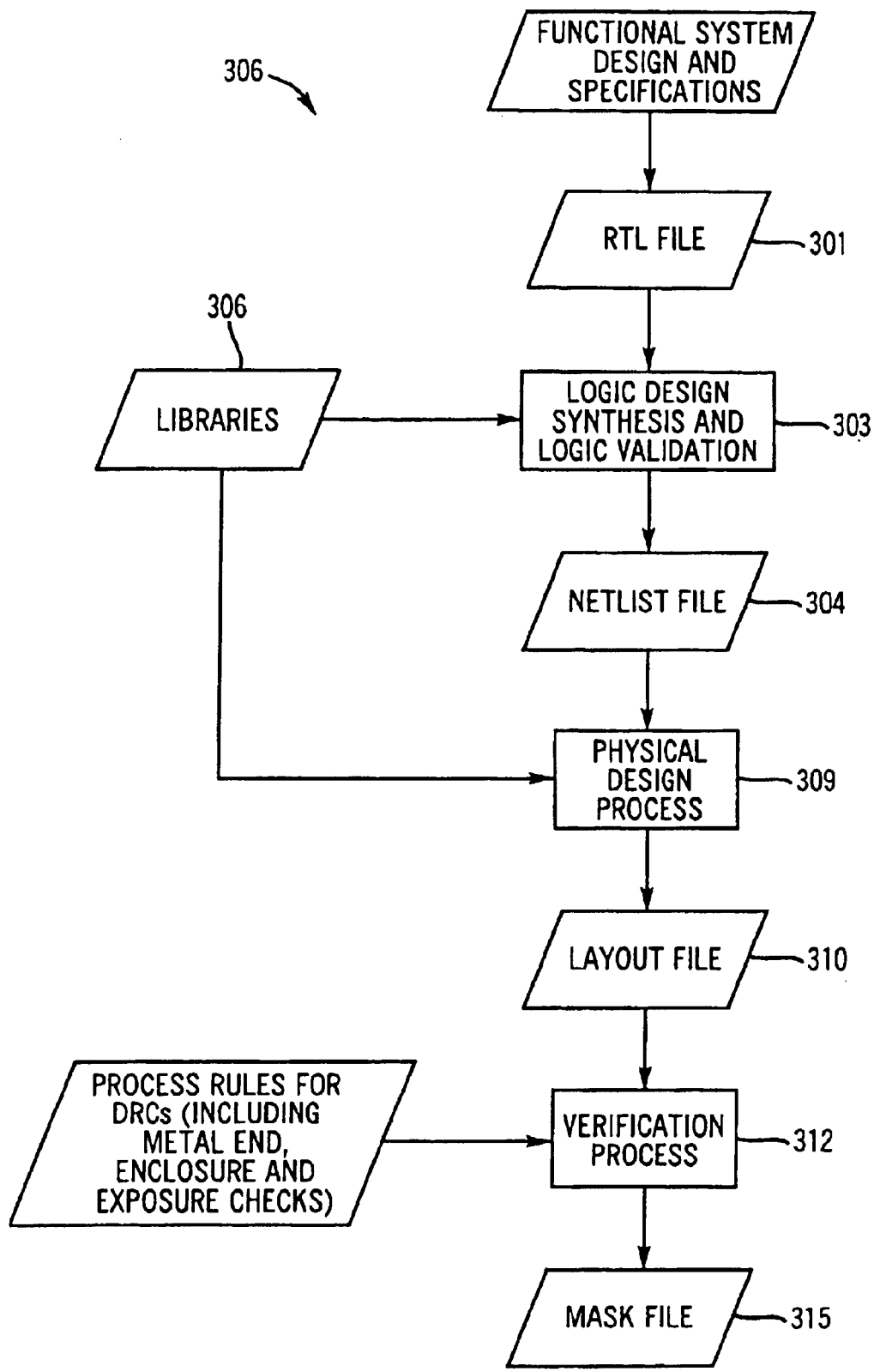

(STEP 1)

(STEP 2)

ADAPTABLE CIRCUIT BLOCKS FOR USE IN MULTI-BLOCK CHIP DESIGN

CROSS-REFERENCE TO RELATED APPLICATIONS

This application claims the benefit of U.S. Provisional Application Ser. No. 60/176,879, filed on Jan. 18, 2000; and claims the benefit of U.S. Provisional Application No. 60/216,746, filed on Jul. 3, 2000. This application is related to U.S. Provisional Application No. 60/177,048, filed Jan. 18, 2000; and to U.S. application Ser. No. 09/765,959, filed Jan. 18, 2001.

BACKGROUND OF THE INVENTION

1. Field of the Invention

The field of the present invention relates to electronic design automation and, more particularly, to methods and systems for constructing integrated circuits and circuit block components using electronic design automation.

2. Background

Chip designers often use electronic design automation (EDA) software tools to assist in the design process, and to allow simulation of a chip design prior to prototyping or production. Chip design using EDA software tools generally involves an iterative process whereby the chip design is gradually perfected. Typically, the chip designer builds up a circuit by inputting information at a computer workstation generally having high quality graphics capability so as to display portions of the circuit design as needed. A top-down design methodology is commonly employed using hardware description languages (HDLs), such as Verilog® or VHDL, for example, by which the designer creates an integrated circuit by hierarchically defining functional components of the circuit, and then decomposing each component into smaller and smaller components.

The various components of an integrated circuit are initially defined by their functional operations and relevant inputs and outputs. From the HDL or other high level description, the actual logic cell implementation is typically determined by logic synthesis, which converts the functional description of the circuit into a specific circuit implementation. The logic cells are then "placed" (i.e., given specific coordinate locations in the circuit layout) and "routed" (i.e., wired or connected together according to the designer's circuit definitions). The placement and routing software routines generally accept as their input a flattened netlist that has been generated by the logic synthesis process. This flattened netlist identifies the specific logic cell instances from a target standard cell library, and describes the specific cell-to-cell connectivity. After this specific cell-to-cell connectivity has been established, the physical design and layout software creates a physical layout file of the integrated circuit, including the physical position of each metal line (i.e., wire) and each via (i.e., metal transition between chip layers). As a last step before creation of the mask file for delivery to the fabrication facility, the physical verification and layout validation software performs several design rule checks (DRCs) on the layout file.

Further explanation of a particular chip design process is set forth, for example, in U.S. Pat. No. 5,838,583, hereby incorporated by reference as if set forth fully herein.

One of the new developments in circuit designs is the advent of so-called virtual component blocks, which, from a general standpoint, are pre-designed and pre-hardened (or semi-hardened) circuit designs in software form (for example, in GDSII format), which can be readily re-used or recycled in different, larger circuit designs. An advantage of virtual component (or VC) blocks is that they reduce the time to design an overall circuit, and thereby increase the speed to market. Virtual component blocks can also be pre-tested and verified from a logical and functional standpoint, also saving time in the test and verification areas.

While virtual component blocks have been found to be advantageous in many contexts, difficulties may be encountered when attempting to define a virtual component block that contains many capabilities yet is sufficiently generic to be used in multiple applications. If too many features are specified, then the virtual component block will be too large for many applications, causing wasted space. On the other hand, if too few features are specified, then very similar additional circuitry will likely be needed in a number of different circuit designs in which the virtual component block is used, resulting in needless duplication of design effort and increased time to reach a final product.

Another problem is that a virtual component block designed to contain the primary processing components of a circuit design may turn out to be rather large, and will often be the largest circuitry block in the circuit design. Such a virtual component block can take up half the available space of an integrated circuit design. Once a large virtual component block is placed in a circuit design, it can be difficult to route a system bus efficiently. It two smaller virtual component blocks are located on opposite sides of a large virtual component block, then the system bus may need to be routed around the large virtual component block, increasing propagation delays and wasting valuable space.

One possible approach to handle such a situation is to place feedthrough wires in a criss-cross pattern within the large virtual component block, to allow signals to pass through the virtual component block if necessary. However, feedthrough wires do not present a very efficient solution to the problem, because the wires are generally too spread out to form a suitable system bus. Moreover, feedthroughs that are not utilized constitute wasted system resources.

Another problem encountered in circuit design in which re-use of pre-established virtual component blocks may be attempted is that the pre-established virtual component blocks are often inflexible or pre-hardened, making layout problematic. If signals between pre-hardened virtual component blocks need to be connected, yet are on opposite sides of each other after placement of the virtual component blocks, then the signal lines (i.e., wires) may be unduly long. Likewise, if signals from a pre-hardened virtual component block needs to be connected to a chip pin not close by, then long signal lines may result. Long signal lines may have undesirable side effects, such as increased signal delay, capacitance, noise and interference. Alternatively, the virtual component blocks may be re-located so that the necessary connections are closer to one another, but then connections to other virtual circuit blocks or chip pins may be made longer.

It would therefore be advantageous to provide techniques to increase flexibility in virtual circuit design, thereby improving convenience and layout particularly of circuit designs incorporating multiple circuit blocks.

SUMMARY OF THE INVENTION

The invention in one aspect is directed to various techniques for providing flexibility in use of virtual component blocks intended to be incorporated in a multi-block circuit design.

In one aspect, a method for hardening a foundation block and utilizing it in a circuit design comprises the steps of defining a virtual component foundation block, the virtual component foundation block described in a functional design language and including a pass-through system bus; hardening an interior region of the virtual component foundation block including at least the system bus; incorporating the virtual component foundation block in a circuit design; and connecting a pair of virtual component blocks at opposite ends of the system bus of the virtual component foundation block, such that the pair of virtual component blocks are capable of directly communicating through the virtual component foundation block over the system bus.

In another aspect, a virtual component library is provided having one or more pre-hardened virtual component foundation blocks, each virtual component foundation block having a hardened interior region including at least a main system bus, and buffers at the external interfaces of the system bus. The foundation block may also comprise a "soft collar" for allowing certain interface parameters to be specified when the foundation block is incorporated into a circuit design. In addition, the foundation block may comprise an internal, hierarchical clocking scheme for even clock distribution and optimum performance. For example, all internal clock delays may be padded, except the longest one, so that the clock signal arrives at all relevant reference points within the foundation block at the same time. Preferably, the foundation block comprises the top-level logic for the overall circuit design.

In another aspect, a method of configuring a hardened foundation block having a set of bus interface connections in relation to a specified set of peripheral components, and a plurality of interchangeable input/output connections along with interface logic, is comprised of the steps of placing peripheral components around the foundation block according to requirements of the peripheral components, and swapping locations of the bus interface connections such that the connections are placed closest to the I/O peripheral components associated with the connections.

Further embodiments, variations and enhancements are also described herein.

BRIEF DESCRIPTION OF THE DRAWINGS

FIG. 3 is a diagram of a general process flow for a circuit design, illustrating various levels of circuit abstraction.

DETAILED DESCRIPTION OF PREFERRED EMBODIMENTS

Preferred embodiments will now be described, with reference as necessary to the accompanying drawings. First, however, additional general background information is provided concerning electronic design automation (EDA) software tools.

As generally explained previously in the Background section hereof, chip designers generally use a top-down design methodology, starting with hardware description languages (HDLs), such as Verilog® or VHDL, for example, to create an integrated circuit by hierarchically defining functional components of the circuit, and then decomposing each component into smaller and smaller components. Two of the primary types of components used in integrated circuits are datapaths and control logic. Control logic, typically random logic, is used to control the operations of datapaths. Datapath areas of the circuit perform functional operations, such as mathematical or other operations.

From the HDL or other high level description, as previously mentioned in the Background section hereof, the actual logic cell implementation is typically determined by logic synthesis, which converts the functional description of the circuit into a specific circuit implementation. The logic cells are then placed and routed, resulting in a physical layout file. The physical layout file is generally used as a design "blueprint" for fabrication of the integrated circuit. At each stage of the design process, as well as at the fabrication stage, various tests may be run to ensure correct operability of the circuit design.

Figure 1:
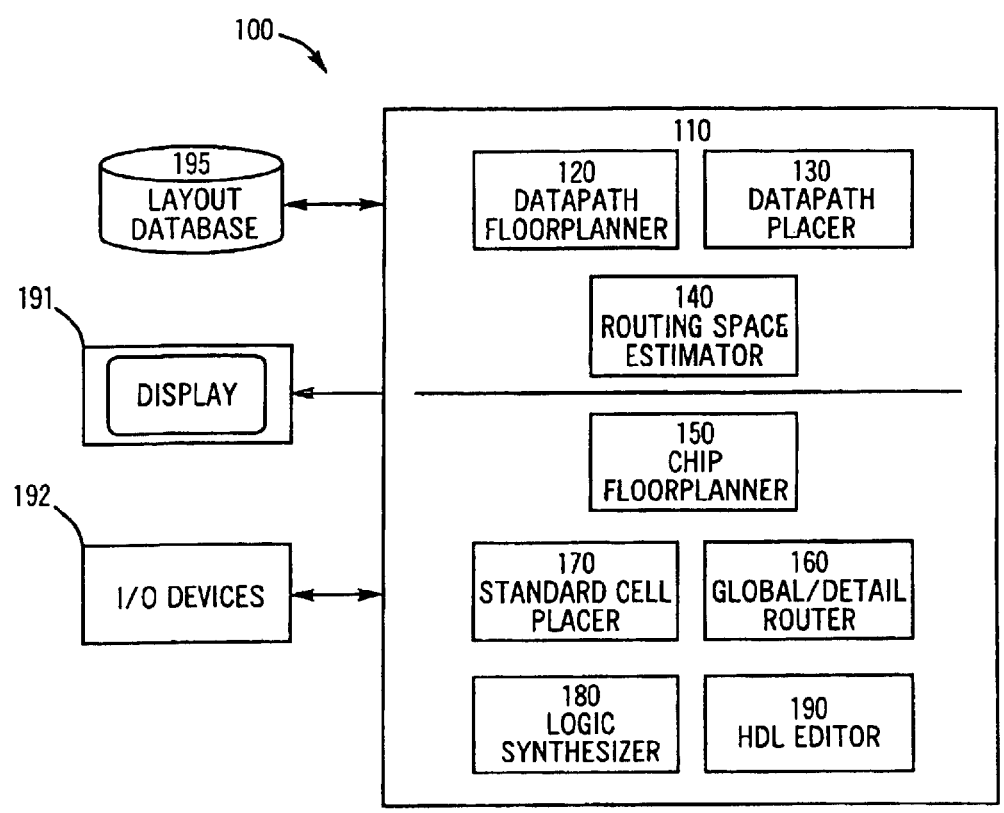
FIG. 1 is a diagram of a computer system that may be used in connection with various embodiments of the invention as described herein.

FIG. 1 is a diagram of a computer system that may be used in connection with various embodiments of the invention as described herein. As shown in FIG. 1, a computer system 100 includes a computer 110 connected to a display 191 and various input-output devices 192. The computer 110 may comprise one or more processors (not shown), as well as working memory (e.g., RAM) in an amount sufficient to satisfy the speed and processing requirements of the system. The computer 110 may comprise, for example, a SPARC™ workstation commercially available from Sun Computers, Inc. of Santa Clara, Calif., or any other suitable computer.

The computer 110 contains stored program code including, in one embodiment, a datapath floorplanner 120, a datapath placer 130 and a routing space estimator 140. The datapath floorplanner 120 provides for the definition of datapath functions, datapath regions, and constraints on these for the purpose of interactive floorplanning operations by the circuit designer, and the control of placement operations of the datapath placer 130. The datapath placer 130 determines the placement of datapath functions within datapath regions, and the placement of logic cell instances within each datapath function, according to the constraints defined by the circuit designer. The routing space estimator 140 estimates routing space required for routing the datapath functions, given the placement of such functions by the datapath placer 130.

In support of the above-mentioned system components, a chip floorplanner 150, global/detail router 160, standard cell placer 170, logic synthesizer 180, and HDL editor 190 may be usefully employed. Operation of the chip floorplanner 150, global/detail router 160, standard cell placer 170, logic synthesizer 180, and HDL editor 190 is conventional, as the design of these components is well known in the art of electronic design automation. Commercially available examples of these system components are Preview™, Cell3™, QPlace™, Synergy™, and Verilog®, respectively.

The computer 110 is preferably coupled to a mass storage device (e.g., magnetic disk or cartridge storage) providing a layout database 195 with which the foregoing system components interface. The layout database 195 may be implemented using the EDIF database standard. The computer 110 may also comprise or be connected to mass storage containing one or more component libraries (not shown) specifying features of electrical components available for use in circuit designs.

Figure 2:
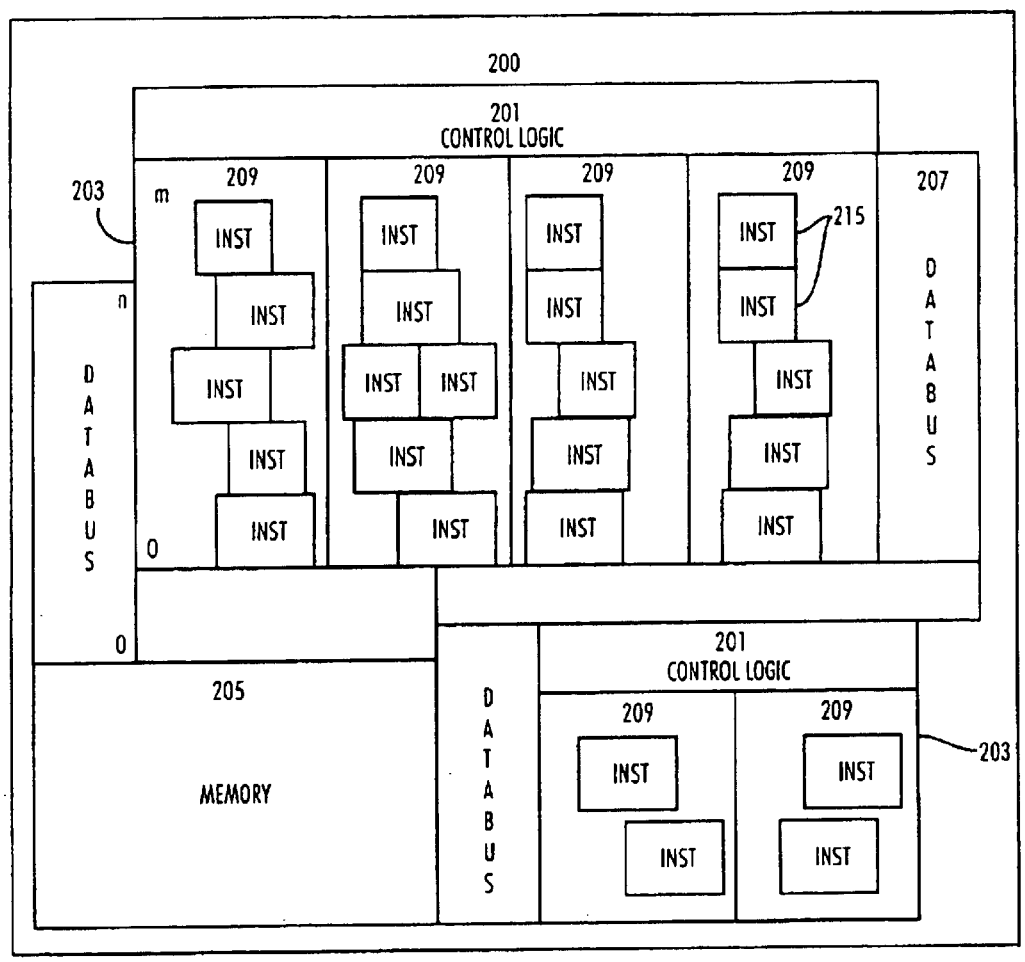
FIG. 2 is a diagram of a simplified integrated circuit as may be generated using a computer system such as shown in FIG. 1.

Referring now to FIG. 2, there is shown a schematic illustration of a simplified integrated circuit 200 that may be represented by circuit design data stored in the layout database 195. In actual, more realistic integrated circuit designs, the integrated circuit 200 would be far more complicated. However, FIG. 2 is useful for purposes of illustration. As shown therein, the integrated circuit 200 comprises of a plurality of control regions 201, datapath regions 203, and memory 205. The various control regions 201, datapath regions 203 and memory 205 are interconnected with databuses 207 generally spanning multiple bits. Each datapath region 203 may comprise a plurality of datapath functions 209. A datapath function 209 may utilize some or all of the bits available from the databus 207. A datapath function 209 may comprise a plurality of cell instances 215 which enable some form of signal or logic transformation of the data passed by the databus 207. The cell instance 215 within a datapath function 209 generally operates on the data carried on the datapath function 209.

As represented in the schema of the layout database 195, the integrated circuit 200 is comprised of a plurality of instances and a plurality of nets. A net interconnects a number of instances, by associating pins on each of the instances or, more generally, by associating the inputs and outputs of a number of instances.

FIG. 3 is a diagram of a general process flow for a circuit design, illustrating some of the various levels of circuit abstraction as described above. As illustrated in FIG. 3, a register transfer logic (RTL) file 301 in the form of an HDL file or other high level functional description undergoes a compile process 303, which typically includes some form of logic synthesis, and converts the functional description of the circuit into a specific circuit implementation which may be stored in the form of a netlist file 304. As part of the compile process 303, a component library 306 is generally referenced, which stores information concerning what types of design components are available, and the characteristics of those design components which are needed in order to determine their functional connectivity. At this process stage, some attempt may be made at circuit optimization in order to minimize the number of components used in the circuit design. The netlist file 304, as previously noted, generally identifies the specific logic cell instances from a target standard cell library, and describes the specific cell-to-cell connectivity.

By application of a physical design process 309 shown in FIG. 3, the logic cells of the netlist file 304 are then placed and routed, resulting in a layout file 310. The component library 306 is utilized in this process stage in order to obtain information concerning the sizes of gates and other components that may be present in the netlist file 304.

From the layout file 310, a verification process 312 may be run, as further illustrated in FIG. 3, resulting in a mask file 315 in, for example, a GDSII or CIF format. The mask file 315 may be provided to a foundry, and contains enough information to allow the foundry to manufacture an actual integrated circuit therefrom.

In one aspect, systems and methods are provided in connection with certain embodiments disclosed herein for "hardening" a virtual component block intended to serve as a "foundation block" for various circuit designs. A virtual component foundation block may itself comprise one or more virtual component blocks, or else may be an entirely custom design, or else may have some virtual component blocks and some custom circuitry. Preferably, a foundation block is tailored for a particular set of applications such as, for example, wireless applications, digital signal processing applications, network applications, multi-media processing applications, etc. A challenge is presented in attempting to select the functional blocks of the foundation block, since it is to be expected that not every implementation will require all of the functional blocks provided in a foundation block. Therefore, to save on chip space and cost of manufacture, it is to be expected that circuit designers will upon occasion seek to eliminate one or more functional blocks internal to a foundation block. On the other hand, a certain level of convenience is provided by having a foundation block that is pre-hardened in advance, particularly with respect to internal components. External interfaces of a foundation block are preferably "soft" so as to allow increased flexibility in placement and interface options with the foundation block.

Preferably, a virtual component foundation block includes functionality allowing it to be utilized as the top-level source of control in an complete integrated circuit design. Other virtual component blocks and custom circuit blocks are generally peripheral to the foundation block. The foundation block typically would have the critical timing features, such as bus, memory, etc. Therefore, the foundation block will generally require the most tuning, and will be a dominant factor in setting the speed of the complete circuit design.

In a preferred embodiment, a virtual component foundation block is provided, with pre-hardened internal features corresponding to various critical timing functions, such as the main system bus. As one example of such an embodiment, buffers may be placed at the external interfaces of the main system bus, thereby allowing timing models of the bus to be developed and analyzed, based upon anticipated loading of the bus. The bus may be hardened based upon a level of bus loading that is pre-selected to cover the most likely range of applications. With such an approach, the foundation block should be provided with a pre-hardened bus having a known, reasonably good performance in most circumstances, although the bus may not have optimal performance for certain potential applications having more extreme bus loading requirements.

In one or more embodiments as disclosed herein, the system bus is placed and hardened along a centerline or near a centerline of the virtual component foundation block. If the virtual component foundation block is relatively large with respect to the overall integrated circuit design in which the foundation block is used, then peripheral virtual component blocks or other external circuitry blocks may conveniently connect to the system bus on opposite sides of the foundation block, thereby alleviating the need to route a system bus around the foundation block. The peripheral blocks may communicate on the system bus through the foundation block, or may communicate with internal circuitry of the foundation block along the system bus. Likewise, internal circuit blocks within the foundation blocks may connect to and communicate with one another over the hardened system bus internal to the foundation block.

Figure 4A:
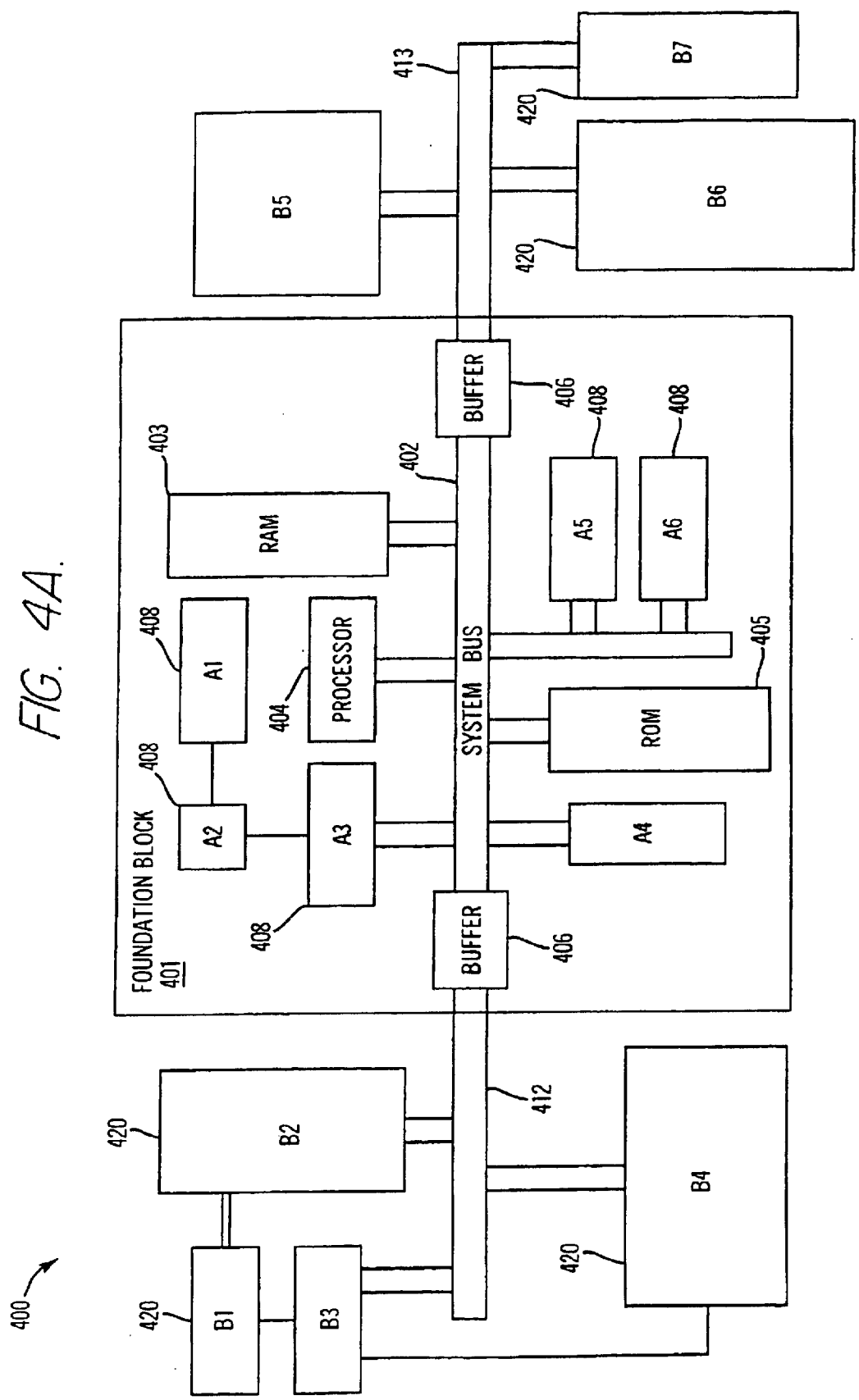
FIG. 4A is a block diagram of a circuit design illustrating placement of a hardened system bus within a virtual component foundation block.

FIG. 4A is a block diagram of a laid-out circuit design 400 illustrating placement of a hardened system bus 402 placed along a centerline or near a centerline of a virtual component foundation block 401. In this example, the virtual component foundation block 401 is relatively large with respect to the overall circuit design 400 in which the foundation block is used. Various internal circuit blocks 408, such as a processor block 404, random-access memory (RAM) block 403, read-only memory (ROM) block 405, and other various internal circuit blocks (designated A1, A2, A3, etc.) may be present in the virtual component foundation block 401. The internal circuit blocks 408 may themselves be virtual component blocks that have been incorporated into the foundation block 401, or else may comprise custom circuitry. The system bus 402 is preferably buffered at either end by buffers 406. Various external circuit blocks 420, which may themselves be virtual component blocks, connect to the external system bus portions 412, 413.

Figure 4B:
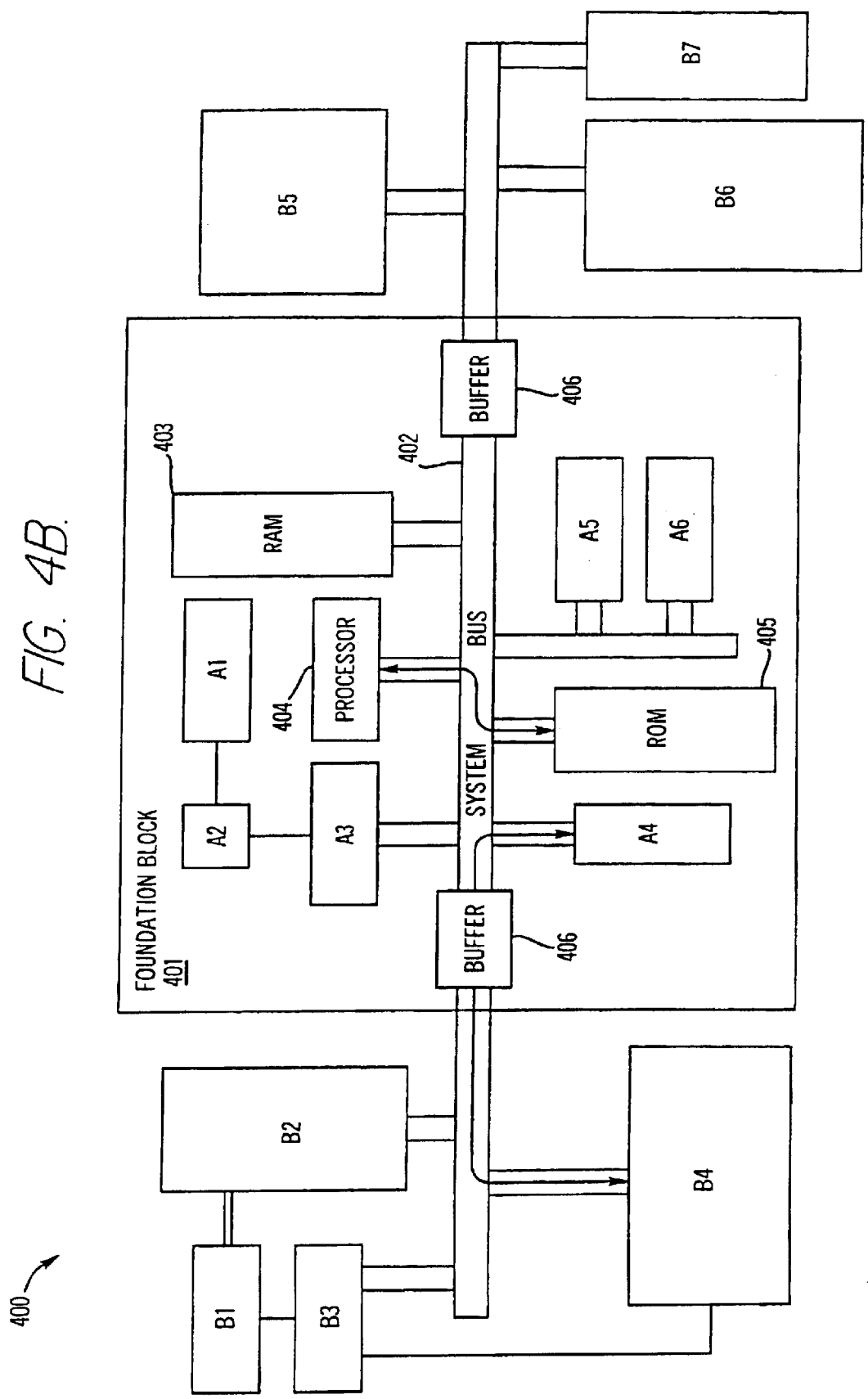
FIGS. 4B and 4C are block diagrams illustrated communication between various circuit blocks in the circuit design of FIG. 4A using the system bus.
Figure 4C:
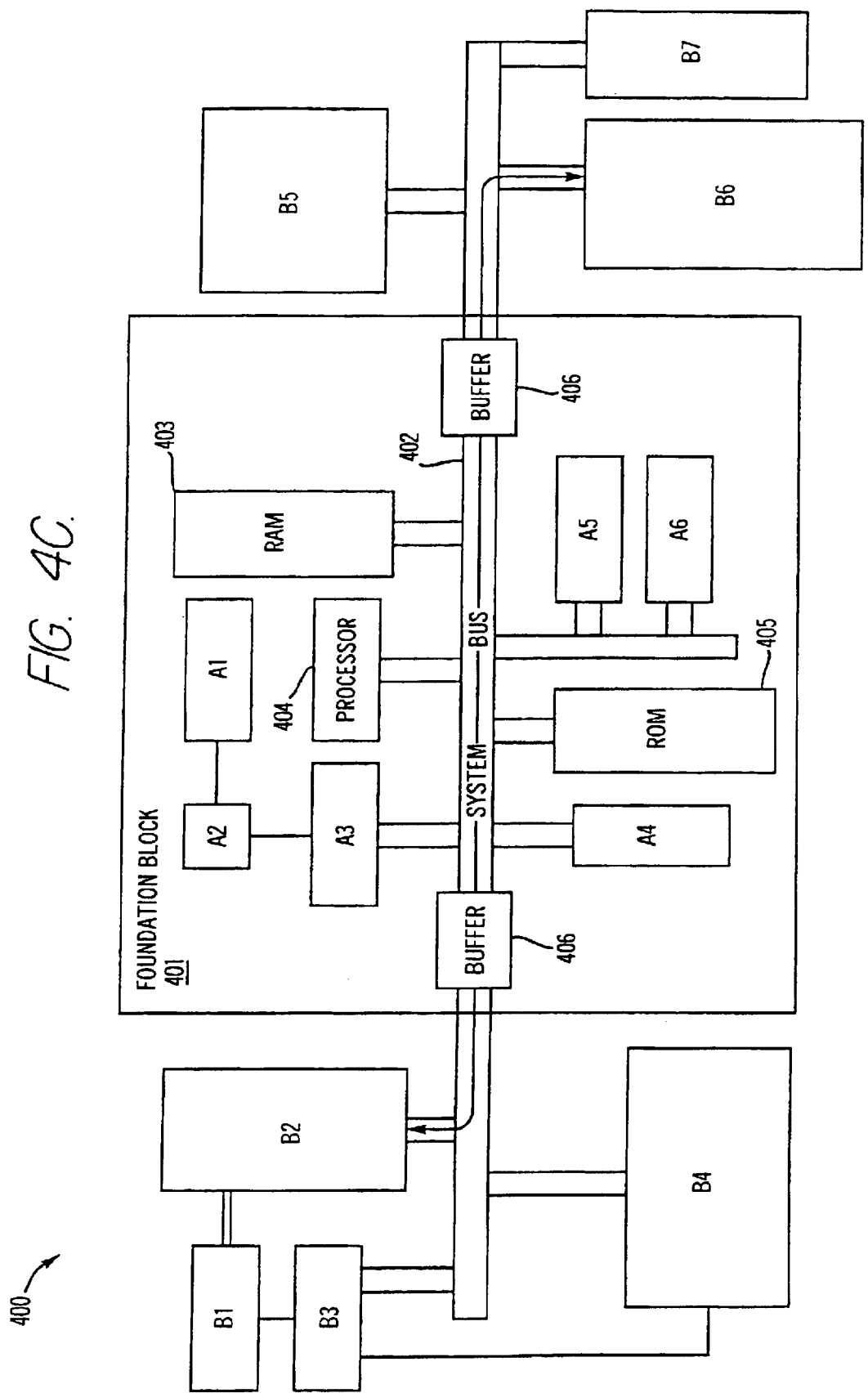

When laid out in the fashion illustrated in FIG. 4, the virtual component foundation block 401 may allow convenient communication between the external circuit blocks 420 connected to the external system bus portions 412, 413, by allowing communication through the system bus 402 of the foundation block 401. Communication between external circuit blocks 420 located on opposite sides of the foundation block 401, via the system bus 402 internal to the foundation block 401, is illustrated in FIG. 4C. Likewise, the system bus 402 of the foundation block 401 may allow communication between two internal circuit blocks 408 of the foundation block 401, or between an external circuit block 420 and an internal circuit block 408. Such modes of communication are illustrated by the communication paths (represented as arrows) in FIG. 4B.

By pre-hardening the system bus 402 internally within the foundation block 401, wire distances between the system bus 402 and the various internal circuit blocks 408 can be minimized. Further, system bus timing can be optimized based upon predicted bus loading characteristics.

In a preferred embodiment, the virtual circuit foundation block 401 includes buffers 406 for the interface of the system bus 402, as well as buffers (not shown in FIG. 4A) for all of the input/output (I/O) pins of the virtual circuit foundation block 401.

In various embodiments as disclosed herein, the virtual circuit foundation block 401 comprises a hierarchical clocking structure which is laid out internally so as to provide clocking signals to the various internal circuit blocks 408 that are evenly matched from a timing standpoint. Internal clocking may be a particular concern with a foundation block 401, due to its relatively large size. According to one method, all of the clock signal lines may be "padded", except for the longest clock signal line, so as to provide similar clock delays at all reference points (within a given tolerance) inside the foundation block 401. Details concerning certain hierarchical clock layout techniques may be found in copending U.S. Provisional Patent Application Ser. No. 60/177,048 filed on Jan. 18, 2000, entitled "System and Method for H-Tree Clocking Layout," hereby incorporated by reference as if set forth fully herein. Other hierarchical clocking techniques may also be used. Alternatively, or in addition, a separate layer of the chip may be set aside for running the clocks.

In one or more embodiments as disclosed herein, the foundation block 401 is hardened to the maximum extent possible internally, but comprises a "soft collar" allowing such things as pin swapping at a later design stage, when the foundation block 401 is placed into a circuit design. Also, a standard interface is preferably used at the periphery of the foundation block 401, to facilitate its integration into circuit designs using other virtual component blocks and standardized circuitry. Further details regarding the use of a soft collar, parameterization and standard virtual component interfaces are described further herein.

Preferably, the virtual component foundation block 401 is rectilinear in nature, so as to maximize the efficiency of a circuit design layout in which the virtual component foundation block 401 is incorporated. In a preferred embodiment, internal circuit blocks 408 which are most likely to be "optional" in the sense that they may not be needed in many of the intended applications of the foundation block 401, are placed in the corner regions of the foundation block 401. Such internal circuit blocks 408, if removed by the circuit designer (as, e.g., part of a derivative design process), will therefore result in generally rectangular foundation block layout with a "notch" in the corner, rather than in the middle of a side of the foundation block. Because it is easier to place an external circuit block 420 in a space having only two existing sides (such as a corner notch) rather than three existing sides (such as a sidewall notch), placing "optional" internal circuit blocks 408 in the corner sections of the foundation block 401 makes it more likely that layout space will not be wasted if an "optional" internal circuit block 408 is removed by the circuit designer.

In one aspect, a method for hardening a foundation block and utilizing it in a circuit design comprises the steps of defining a virtual component foundation block, the virtual component foundation block described in a functional design language and including a pass-through system bus; hardening an interior region of the virtual component foundation block including at least the system bus; incorporating the virtual component foundation block in a circuit design; and connecting a pair of virtual component blocks at opposite ends of the system bus of the virtual component foundation block, such that the pair of virtual component blocks are capable of directly communicating through the virtual component foundation block over the system bus.

In another aspect, a virtual component library is provided having one or more pre-hardened virtual component foundation blocks, each virtual component foundation block having a hardened interior region including at least a main system bus, and buffers at the external interfaces of the system bus. The foundation block may also comprise a "soft collar" for allowing certain interface parameters to be specified when the foundation block is incorporated into a circuit design. In addition, the foundation block may comprise an internal, hierarchical clocking scheme for even clock distribution and optimum performance. For example, all internal clock delays may be padded, except the longest one, so that the clock signal arrives at all relevant reference points within the foundation block at the same time. Preferably, the foundation block comprises the top-level logic for the overall circuit design.

At the definition stage of a foundation block a bus structure may allow for a maximum number of as-yet-unassigned initiators or targets so that peripheral blocks can plug into the bus at a later, or derivative, design stage. The virtual component interfaces may be soft, parameterized, and either master or slave, depending upon what kind of peripheral circuit blocks are utilized at the later design stage. When the later or derivative design stage is completed, any unused virtual component interfaces that are not hardened may be tied off or removed.

According to various other embodiments disclosed herein, a system and method for pin unscrambling is provided. Pin unscrambling can be useful when a virtual circuit block has a fixed or limited number of ports. For example, a foundation block may be defined and fixed (i.e. "hardened") to have a fixed bus configuration with a specific number of ports. Hardening the foundation block to at least this extent can be advantageous where design requirements based on time-critical functionality must be met. Ports are generally positioned evenly around the foundation block to provide for floor-planning flexibility. A virtual component interface (VCI) normally acts to enable a "standard" means of communication between the I/O bus interfaces for the foundation block and the associated peripheral components. The virtual component interface thereby provide a means of communication regardless of the type of bus used in the foundation block or the type of peripheral component. For example, the virtual component interface is typically expandable to enable bandwidth conversion such as that performed by a multiplexer.

While the foundation block internally is hardened, a need for level of flexibility at its I/O interfaces may exist. The foundation block's I/O buffer interfaces remain unfixed and are later set based on the preferences or needs of associated peripheral components in the design of the collar around the foundation block. Nevertheless, in the initial layout of a foundation block, tentative pin assignments at the interfaces are normally made. To meet the needs of a specific application having particular requirements for peripheral components, an efficient and flexible means of configuring a foundation block's I/O interfaces from its tentative interface layout is desired. Thus, a method for specifying pin locations, or pin unscrambling, is disclosed herein.

A preferred method of configuring the interfaces between a hardened foundation block and a specified set of peripheral components preferably includes the following steps. First, the specified peripheral components are placed around the foundation block. In this placement, consideration is preferably paid only to the communication and layout requirements of the peripheral components and not the foundation block bus interfaces. This prioritization towards peripheral component requirements is based on the fixed pin arrangement that normally exists between peripheral components at this stage of design. By preferably giving the peripheral component arrangement highest priority, the likelihood of having to subsequently modify the locations of the peripheral components is minimized. In the next step, the locations of bus interface connections of the foundation block are preferably swapped such that the connections are placed closest to the I/O peripheral components associated with the connections. This swapping is possible because the bus interfaces preferably are commutative groups of pins. Swapping decisions are preferably based on a comparison of average distances between the bus interfaces and the peripherals component I/Os to the foundation block. After swapping, the bus interfaces are generally in the correct locations with respect to the peripherals they are associated with. The pins, however, are usually scrambled with respect to the virtual component interfaces and the peripheral components. If the I/Os for the peripheral components are hardened, the swapping of foundation block bus interfaces is preferably the final step of the configuration process.

However, if the I/Os for the peripheral components are soft, then because the foundation block pins are preferably fixed, the configuration process preferably continues by forcing an unscrambling of the pins "outward" towards the peripheral components. The next step, therefore, is to unscramble the pins between the foundation block and the virtual component interface. To do this, the virtual component interface logic is preferably repositioned to unscramble its I/O connections to the foundation block, and minimize wire lengths. The unscrambling is preferably performed by modifying the placement of the virtual component interface logic with priority towards the I/O interfaces of the foundation block. Such modification is based on minimizing distances. After this step is completed, the virtual component interface logic appears scrambled relative to the peripheral component I/Os. Thus, similar to the previous step, in the next step, the soft peripheral I/Os are replaced to unscramble their connection to the virtual component interfaces.

Figure 5A:
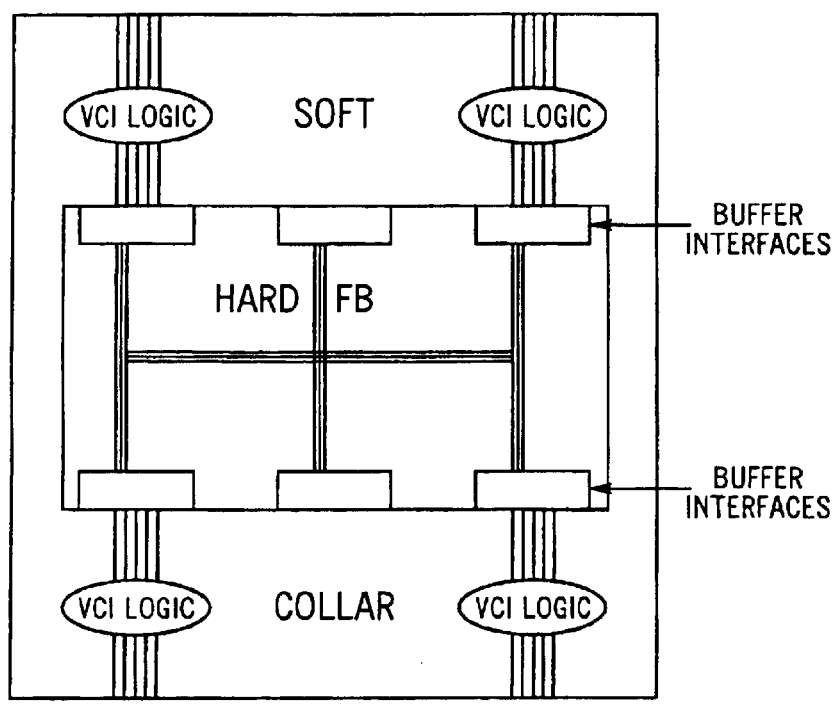
FIGS. 5A and 5B are diagrams of a hardened virtual circuit block having soft interfaces.
Figure 5B:
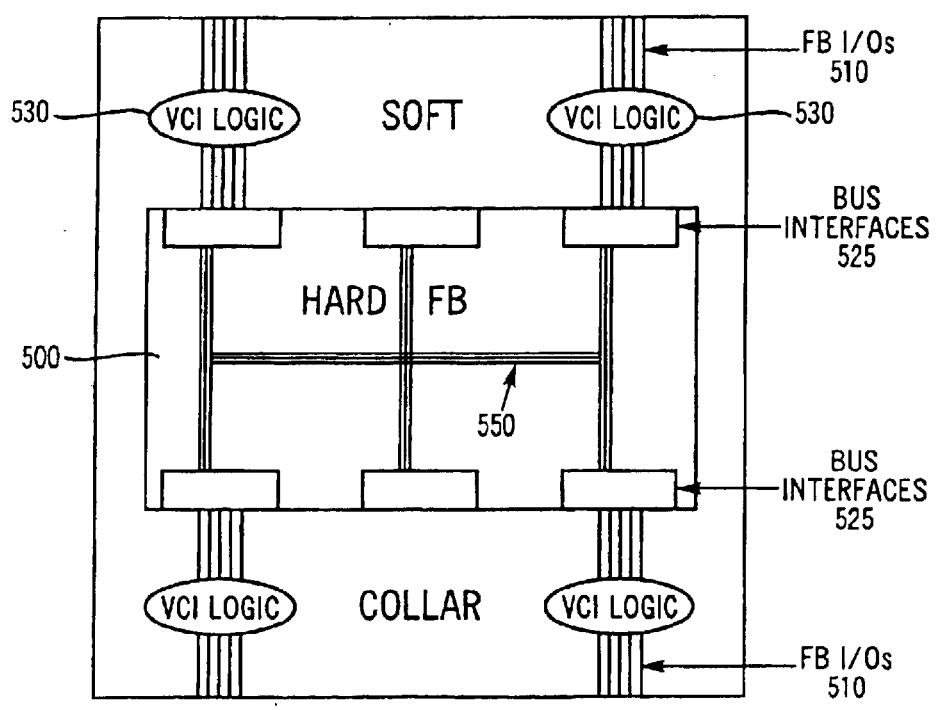

The timing model of a foundation block (or other virtual circuit block having soft collars) may be carried out prior to the last pass of top level timing analysis and floor planning for the block. An explanation of this process, and associated pin unscrambling, may be described with reference to FIGS. 5A, 5B and 6. FIG. 5B illustrates a hardened foundation block 500 with bus interfaces 525, as part of a virtual component block 575. VCI logic sections 530 connect the bus interfaces 525 to input/output connections 510 of the foundation block 500. Thus, the signals on the edge of the hardened foundation block 500 are buffered from the internal bus 550 by the bus interfaces 525 and VCI logic sections 530 (shown conceptually in FIG. 5A). To facilitate pin unscrambling, the pins of the input/output connections 510 are preferably part of a commutative group, with the same signals on each of the bus interfaces 525.

According to a preferred embodiment, peripheral blocks are placed around the virtual circuit foundation block 575 during an initial floorplanning process, and various interconnections carried out (e.g., between circuit blocks, or from circuit blocks to chip I/O pins). The peripheral blocks are preferably placed at this stage without regard to the particular orientation with respect to the virtual circuit foundation block. Before the last pass of floorplanning, a placement process is preferably carried out. Such a process is graphically illustrated in FIG. 6. Generally, the placement process involves shuffling the VCI logic blocks 530 so that they are located as close as possible to the peripheral blocks to which they will connect, then re-synthesizing the soft VCI logic blocks 530 so as to minimize wire lengths. By way of reference to the larger design process, the steps of FIG. 6 would take place in the physical design process 309 illustrated in FIG. 3.

Figure 6:
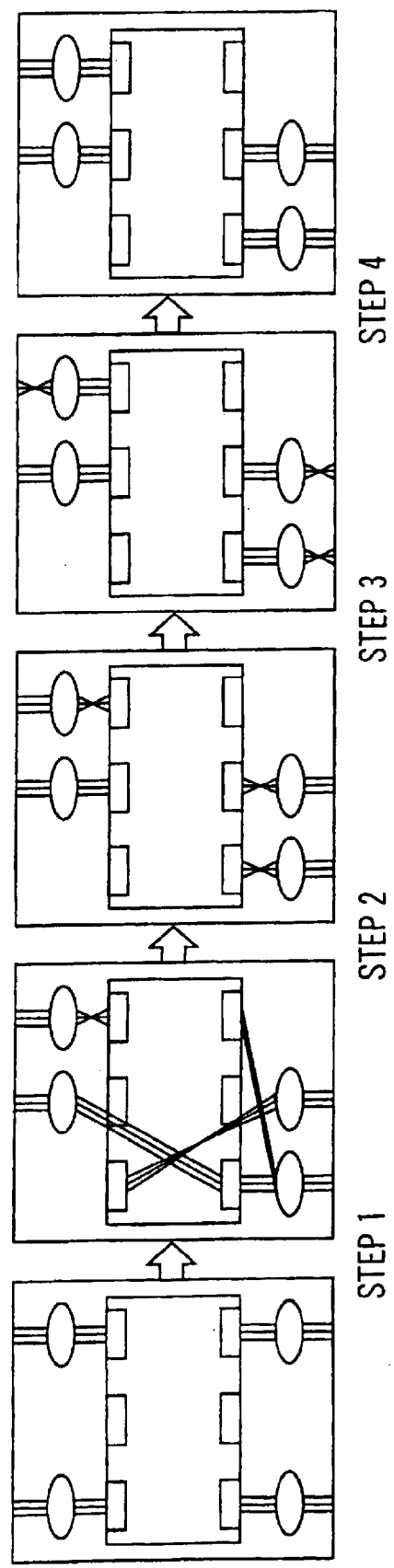
FIG. 6 is a graphical illustration of a process for pin unscrambling.
Figure 7:
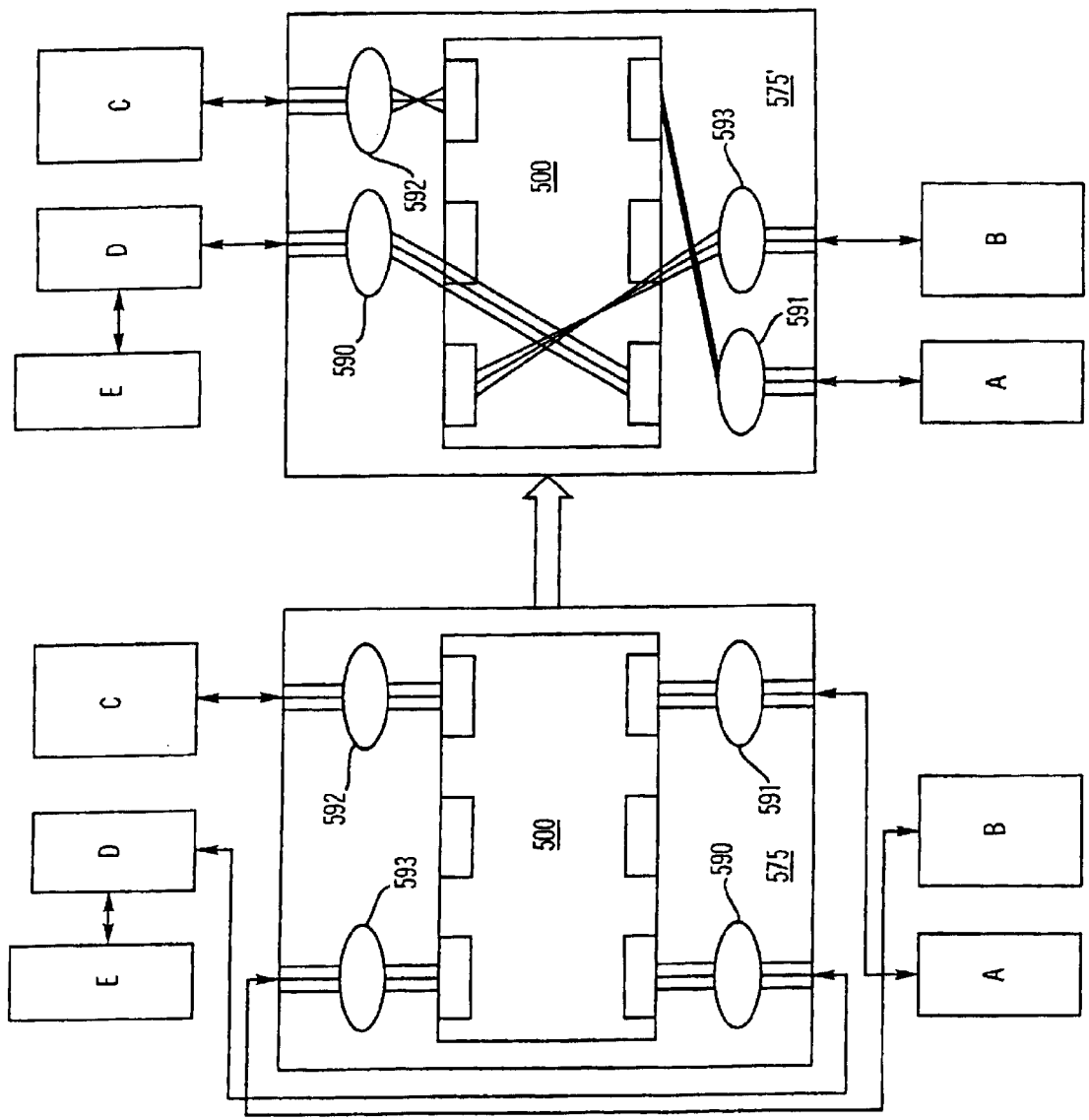
FIGS. 7 and 8 are diagrams illustrating the first two steps of FIG. 6 in more detail, relative to a concrete example of a foundation block with peripheral blocks.

According to the process shown in FIG. 6, first, an initial placement is made of the soft collar of the virtual circuit foundation block 575, using a placement software program. Preferably, during placement, high priority is given to the nets of the input/output connections 510, and no or very low priority to the nets of the bus interfaces 525. This step may be explained in more detail with reference to FIG. 7, which illustrates the initial part of the process of FIG. 6 in more detail, showing the foundation block 575 situated with respect to various peripheral blocks. In particular, FIG. 7 illustrates an example of a placement that might occur of the virtual circuit foundation block 575 with respect to peripheral blocks A, B, C, D and E initially, when the peripheral blocks are placed without regard to port connections on the virtual circuit foundation block 575. FIG. 7 further illustrates the result of the placement process when no or very low priority is given to the nets of the bus interfaces 525, resulting in modified virtual circuit foundation block 575'. Because of the soft collar around the hardened foundation block 500, the VCI logic blocks 591, 592, 593 and 594 can be re-located even at this part of the design stage, even though the foundation block 500 itself is hardened.

Figure 8:
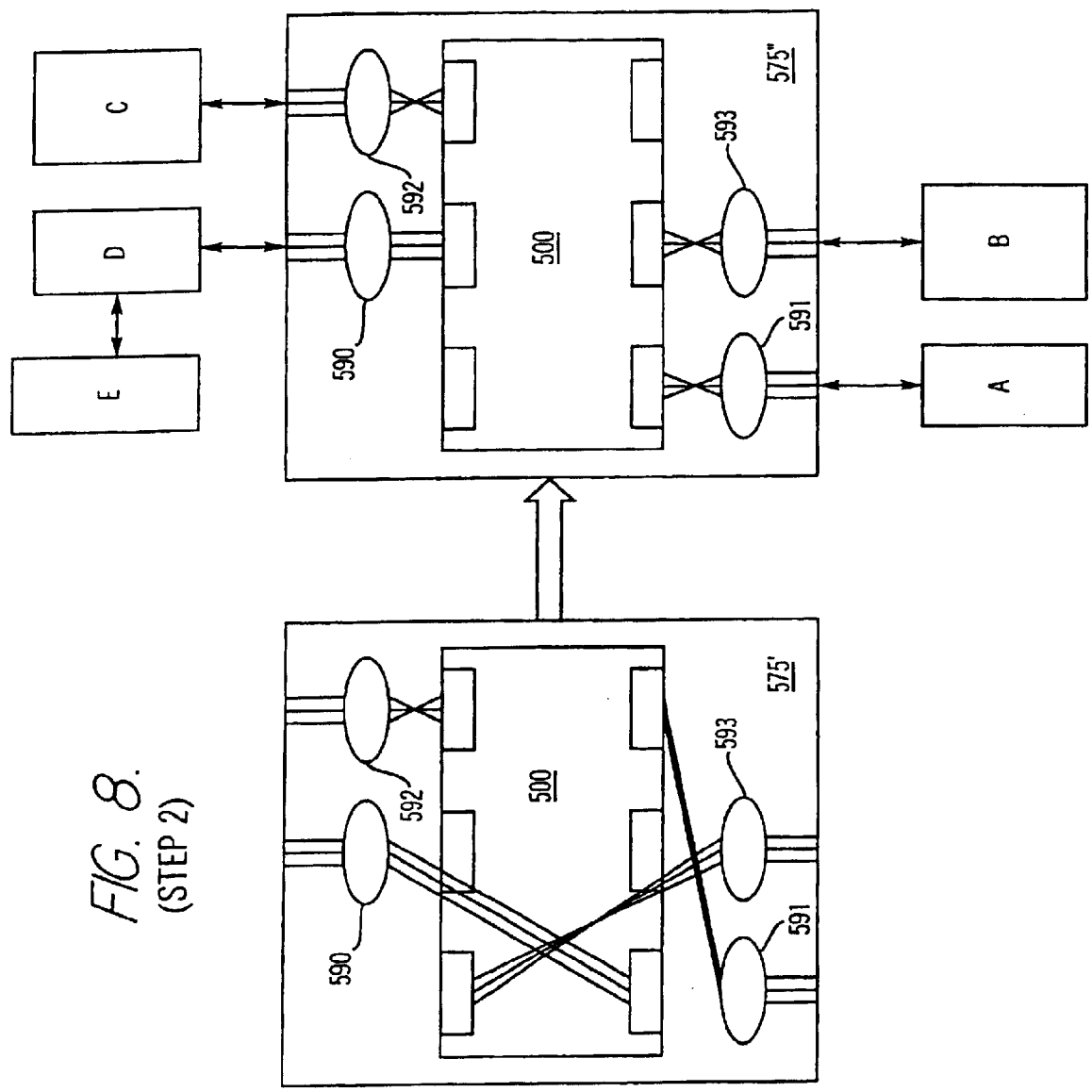

Next according to the process shown in FIG. 6, after the placement pass in which no or very low priority is given to the nets of the bus interfaces 525, the process involves swapping the bus interface connections with ones that are closest, on an interface-by-interface basis. This step is illustrated in more detail in FIG. 8. As shown therein, VCI logic blocks 590, 591, 592 and 593 are disconnected from the bus interfaces 525 to which they were originally connected, and then re-connected to the closest bus interface 525. This step is possible because of the nature of the collar around the foundation block 500. It is also possible because the bus interfaces 525 are preferably commutative, such that they can be readily swapped with one another. In particular, the bus interfaces 525 are "generic" in nature, such that they can be either targets or initiators. A combined initiator/target interface that may be used for this purpose is described in copending U.S. application Ser. No. 09/765,959 (attorney docket number 260/088) filed concurrently herewith, and hereby incorporated by reference as if set forth fully herein. The result of this step is another modified virtual circuit foundation block 575" as shown in FIG. 8.

If the bus connections 525 do not have the capability of being either a target or initiator, then certain bus connections 525 will be designated as targets and others as initiators. In such a case, the VCI logic blocks 530 can only be re-assigned to bus connections of the same type—i.e., either a target or an initiator, depending upon its needs.

Next according to the process shown in FIG. 6, another placement step is carried out, in which the virtual circuit interface (VCI) logic sections 530 are re-placed based on the bus interface connections, with no priority given to the input/output connections 510. During this stage, the rest of the placement of the circuit design is kept intact. The result is shown in FIG. 6, wherein the wires connecting the VCI logic interfaces 530 to the bus interfaces 525 are as direct as possible, and the wires connecting the VCI logic interfaces 530 to the peripheral blocks (via the I/O connections 510) may be disarranged.

Next according to the process shown in FIG. 6, another placement step is carried out, by which the input/output connections 510 are re-placed to minimize the wire length from the input/output connections 510 to the virtual component interfaces 530. This step is again possible because of the soft nature of the VCI logic blocks 530, allowing their logic to be re-synthesized as necessary to re-assign pin outputs so as to match up with the input/output connections 510.

Once the foregoing steps have been carried out, a new TLF is generated for the virtual circuit block 575. The floorplan is then rerun with the new fixed virtual circuit block input/output pin placement, to force the virtual circuit block's pin ordering back to the peripheral blocks. As a result, the virtual component interfaces have been tailored to the peripheral components to which they will connect, and, moreover, only the bus interfaces are the same for all the virtual component interfaces. By effectively "floating" the input/output pins, they are moved to where the floorplan requires. By swapping the bus pins, the proper assignment between the peripheral components and the virtual component block 575 is made. By replacing the foundation block input/output pins, once in the generally correct location, the correct orientation of the peripheral component can be caused by forcing the new pin assignment of the foundation block back onto the peripheral blocks.

These same techniques can be applied to clock signals, which may be placed in a commutative group for all outputs from the foundation block with the same delay and base clock frequency or frequencies.

Although the use of soft collars was described in the example above with respect to a virtual circuit foundation block, the same technique is applicable to any virtual circuit block with pre-hardened internals.

The foregoing methods may be implemented in software using a processor with sufficient memory and computational power and providing a design interface for a user. In the method, a user is prompted to place I/O peripheral components around a foundation block that is broadly designed to operate with the I/O peripherals. Once the peripherals are positioned, the processor executes the pin unscrambling process, such that bus and virtual component interfaces, and the I/Os between the peripheral components and the virtual component interfaces are optimally repositioned.

In a preferred embodiment therefore, a method of configuring a hardened foundation block having a set of bus interface connections, wherein each bus interface connection includes a set of pins, in relation to a specified set of peripheral components, and virtual component interfaces (VCIs) associated with the specified set of peripheral components, is comprised of the steps of placing peripheral components around the foundation block according to requirements of the peripheral components; and swapping locations of the bus interface connections such that the connections are placed closest to the I/O peripheral components associated with the connections.

Alternatively, given the preferred embodiments above, the method may further be comprised of the step of configuring logic in each virtual component interface based on the locations of pins of the bus interface connections.

Alternatively, given the preferred embodiments above, the method further may further be comprised of the step of configuring logic in each I/O peripheral component based on locations of pins of the virtual component interfaces.

Various techniques are disclosed herein for a methodology of designing foundation blocks that are as flexible in their utility as possible. Flexibility in a foundation block enables a broader array of derivative designs. Because of the importance of flexibility, foundation blocks are preferably designed to be rectilinear and with as much parameterization as possible.

One design methodology that promotes parameterization and rectilinearity in foundation block design is as follows. Initially, the functional elements that are not subject to change are determined. Such elements, for example, might include timing-critical logic blocks. These elements, along with other likely functional elements, such as memory, are preferably explicitly placed on the edges of the foundation block. Another step is to identify elements that are programmable, subject to change or "soft." Such elements often include protocols and virtual component interfaces to peripherals. Preferably, the process provides an option of programmability in the sizes of placed memory and the size of an existing bus layout. Preferably, whether the bus size is increased or decreased, the bus layout spans the foundation block in a regular and even manner. The methodology is preferably automated using a processor with memory having a user interface that guides the designer through the foundation block design process.

One method of designing foundation block towards rectilinearity comprises the steps of placing likely functional elements including memory on edges of the foundation block; explicity placing memory dedicated to one of the likely functional elements on at least one of the edges of the foundation block; modifying a size for an initial bus layout for the foundation block evenly across the foundation block; parameterizing existing protocol options; and providing for expandability of placed memory along the edges of the foundation block.

One aspect of the flexibility of virtual component library elements is their ability to be parameterized. Another aspect of flexibility involves the ability to re-implement the design in a different form, soft to hard, from one process to another. Flexibility is important in minimizing the platform development effort, because the more flexible a platform is, the more derivative designs to which it can be tailored. Reuse can also be important to the cost-effective use of a platform. The foundation blocks of a platform preferably therefore have at least parameterized virtual component interfaces, as previously described, and they can also have parameterized functional options.

The level of functional parameterization is preferably defined prior to hardware implementation in the system design phase. Such parameterization can also embedded as meta-code or programs in the top-level design from system design. The qualification process in the base flow preferably adds parameterized virtual component interfaces to the foundation block.

There are at least two ways to configure a system: soft configuration and parameterization. Soft configuration includes configuring registers in the design to select the function options. These options are set during initialization and changed by RTOS commands from the processor. An example of this approach is the configuration of a serial interface. There are often a number of options, including, for example:

The number of bits in a byte (7 or 8)

The number of stop bits (1 or 2)

The number of start bits (0 or 1)

These options can be represented in a virtual component block as bit values stored in specific configuration registers that are addressed through the bus interface. The configuration bits can be read or set by, e.g., writing or reading the specific address.

Setting configuration bits may normally be done during initialization, but can also be done prior to or during usage of the specific virtual component block. An example of this principle is the current modem technology, which reconfigures itself, searching for the best bandwidth to communicate with the modem on the other side of the telephone connection.

Qualification, which happens at the end of the base flow, preferably covers all the possible legal values that can be used in the configuration registers. If one group of settings is independent of the other groups, then verifying the correct operation of each possible value is sufficient.

Parameterization, another form of configuring a virtual component block, can take at least two different forms. First, parameterization can be used to drive logic generators. Second, it can be used to select options that already exist within the design. Both parameterization approaches are preferably defined by keywords.

A foundation block preferably has parameterized virtual component interfaces. Virtual component interface parameterization should be at least as broad as the capabilities of the bus to which it is connected. While the virtual component interfaces are preferably parameterized, it is possible for a derivative design of a foundation block to have a peripheral block that requires more functionality on its virtual component interface than can be supplied by the foundation block bus. For example, a peripheral block might be designed to initiate multiple interleaved transactions to different devices at the same time, which requires some type of thread ID. Although the peripheral block might have thread capability, the bus might not be able to handle threaded transactions. In this situation, errors can result that can be difficult to detect because they occur infrequently. The VC interface logic is preferably robust enough to generate erros under such conditions.

Parameterization can be done in several different forms. First, in the form of logic generation, keywords direct the generator to generate the appropriate logic programmatically. For example, a "MEMSIZE" parameter can be used in the Verilog® code to define the size of a memory, Mem [0::7,0::MEMS1ZE], and the associated register connections to it. This keyword generates the proper design when creating simulation models or synthesizing the logic. Parameterization may also be carried out using "select" options. In this form of parameterization, the keywords translate into tie-off conditions for the selection logic. Hard blocks generally can be configured by this approach only.

As an example, assume that the outputs of two blocks of logic in a design are selected by a multiplexer. The control signal on the multiplexer, when tied to the correct state, selects the chosen function. Synthesis then eliminates the multiplexer and the unused function.

Further description will now be provided regarding keyword organization, user parameterization, and aspects and structure of foundation block parameterization.

To minimize errors created by setting incorrect parameters during integration, it is preferable to use standard, self-explanatory words and values wherever possible. Parameters should be organized into groups. For example, they may be divided into three main groups, as those that affect functionality of the virtual component block those that affect interface structure or protocol, and those that affect physical implementation of the virtual component block. Examples of functional keywords are "Cache_size" and "Memory_size". Examples of interface structure or protocol keywords are "Data_Bus_size" and "Address_space". Examples of physical implementation parameters are "Adder_type" (e.g., carry select, ripple carry), "Wait_Cycles" and "Cycle_time". Parameters should be organized so as to minimize conflict and eliminate redundancy.

Graphic user interfaces are conventionally available allowing users to select from available options or key in the desired values for sizes and other parameters. Such interfaces are particularly useful when more details are needed to correctly define a parameter and its options. User interfaces for individual blocks should be extendable, possibly as one of many pages of user interface, so the foundation block user interface can be easily created as a compendium of its blocks' GUIs. These individual-block GUIs preferably should have a facility to link related parameters between pages so they will always have consistent values.

The following parameters may be available for each virtual circuit interface (VCI) that may be present in, e.g., a foundation block virtual circuit design:

VCI type (basic, peripheral)

VCI direction (master, slave)

VCI data size

VCI address size

VCI address space (start and end)

VCI cell size

VCI packet size

VCI endian type (big, little)

Although not required, it is also useful to have the following:

VCI port priority

FB bus arbitration (polling, serial)

In addition to the virtual circuit interface parameters, it may be useful to parameterize other externals, such as, e.g., interrupts, test pins, clocks, and resets. Internal functions that are useful to parameterize are:

The VC interface queue depth

Memory sizes, including cache

All appropriate implementation parameters

These rules should be checked for all of the virtual component interface parameters during the qualification process at the end of the base flow.

Additional information relating to various aspects of virtual component blocks may be found in U.S. Provisional Patent Application Ser. Nos. 60/176,879 filed on Jan. 18, 2000, and Ser. No. 60/216,746 filed Jul. 3, 2000, both of which applications are hereby incorporated by reference as if set forth fully herein.

While preferred embodiments of the invention have been described herein, and are further explained in the accompanying materials, many variations are possible which remain within the concept and scope of the invention. Such variations would become clear to one of ordinary skill in the art after inspection of the specification and the drawings. The invention therefore is not to be restricted except within the spirit and scope of any appended claims.

What is claimed is:

1. A method for hardening a circuit block and utilizing it in a circuit design, comprising the steps of:

defining a virtual component foundation block, the virtual component foundation block described in a functional design language and including a pass-through system bus;

hardening an interior region of the virtual component foundation block including at least the system bus;

incorporating the virtual component foundation block in a circuit design; minimizing wire distances between each virtual component block and the system bus; and connecting a pair of virtual component blocks at opposite ends of the system bus of the virtual component foundation block, such that the pair of virtual component blocks are capable of directly communicating through the virtual component foundation block over the system bus.

2. The method of claim 1, further comprising:

placing the system bus substantially on a centerline of the virtual component foundation block.

3. The method of claim 1, further comprising:

defining the virtual component blocks within the virtual component foundation block.

4. The method of claim 1, further comprising:

allowing communication of circuit blocks external to the virtual component foundation block through the system bus of the virtual component foundation block.

5. The method of claim 1, further comprising:

providing a hierarchical clock structure to the virtual component foundation block.

6. A method of configuring a design of an integrated circuit comprising:

hardening a portion of a foundation block design, including a set of bus interface connection designs;

placing the foundation block design in relation to a specified set of peripheral component designs;

associating designs of virtual component interfaces located in a soft portion of the foundation block design with the specified set of peripheral component designs;

shuffling the virtual component interface designs to reduce a distances between a first virtual component interface design and first peripheral component design; and adjusting design locations of the virtual component interface designs of the foundation block design to place at least one virtual component interface design closer to its associated peripheral component design.

7. The method of claim 6, further comprising:

connecting each virtual component interface design to one of the bus interface connection designs.

8. The method of claim 6, further comprising:

generating a plurality of floating point input and output pins for each virtual component interface design in the soft portion of the foundation block design.

9. The method of claim 8, wherein the soft portion comprises:

a programmable region of the block.

10. The method of claim 9, wherein parameters of the floating input and output pins in the programmable region, and parameters of the virtual component interface designs in the programmable regions, can be changed.

11. The method of claim 6, further comprising:

commuting the bus interface connection designs to reduce a distance between a first virtual component interface design and the bus interface connection design connected to the first virtual component interface design.

12. The method of claim 6, further comprising:

unscrambling connecting wires between a first virtual component interface design and the bus interface connection design connected to the first virtual component interface design.

13. An apparatus for hardening a circuit block and utilizing it in a circuit design, comprising:

means for defining a virtual component foundation block, the virtual component foundation block described in a functional design language and including a pass-through system bus;

means for hardening an interior region of the virtual component foundation block including at least the system bus;

means for incorporating the virtual component foundation block in a circuit design; means for minimizing wire distances between each virtual component block and the system bus; and means for connecting a pair of virtual component blocks at opposite ends of the system bus of the virtual component foundation block, such that the pair of virtual component blocks are capable of directly communicating through the virtual component foundation block over the system bus.

14. The apparatus of claim 13, further comprising:

means for placing the system bus substantially on a centerline of the virtual component foundation block.

15. The apparatus of claim 13, further comprising:

means for defining the virtual component blocks within the virtual component foundation block.

16. The apparatus of claim 13, further comprising:

means for allowing communication of circuit blocks external to the virtual component foundation block through the system bus of the virtual component foundation block.

17. The apparatus of claim 13, further comprising:

means for providing a hierarchical clock structure to the virtual component foundation block.

18. An apparatus for configuring a design of an integrated circuit comprising:

means for hardening a portion of a foundation block design, including a set of bus interface connection designs;

means for placing the foundation block design in relation to a specified set of peripheral component designs;

means for associating designs of virtual component interfaces located in a soft portion of the foundation block design with the specified set of peripheral component designs; means for shuffling the virtual component interface designs to reduce a distances between a first virtual component interface design and first peripheral component design; and means for adjusting design locations of the virtual component interface designs of the foundation block design to place at least one virtual component interface design closer to its associated peripheral component design.

19. The apparatus of claim 18, further comprising:

means for connecting each virtual component interface design to one of the bus interface connection designs.

20. The apparatus of claim 18, further comprising:

means for generating a plurality of floating point input and output pins for each virtual component interface design in the soft portion of the foundation block design.

21. The apparatus of claim 20, wherein the soft portion comprises:

a programmable region of the block.

22. The apparatus of claim 21, wherein parameters of the floating input and output pins in the programmable region, and parameters of the virtual component interface designs in the programmable regions, can be changed.

23. The apparatus of claim 18, further comprising:

means for commuting the bus interface connection designs to reduce a distance between a first virtual component interface design and the bus interface connection design connected to the first virtual component interface design.

24. The apparatus of claim 18, further comprising:

means for unscrambling connecting wires between a first virtual component interface design and the bus interface connection design connected to the first virtual component interface design.

\* \* \* \* \*